United States Patent
Hopkins

(12) 
(10) Patent No.: US 6,172,535 B1
(45) Date of Patent: Jan. 9, 2001

(54) HIGH-SPEED ANALOG COMPARATOR STRUCTURES AND METHODS

(75) Inventor: Michael Clarence Hopkins, Mebane, NC (US)

(73) Assignee: Analog Devices, Inc., Norwood, MA (US)

( * ) Notice: Under 35 U.S.C. 154(b), the term of this patent shall be extended for 0 days.

(21) Appl. No.: 09/433,841

(22) Filed: Nov. 4, 1999

(51) Int. Cl.[7] .................................................. H03K 5/22
(52) U.S. Cl. ................................................ 327/66; 327/65
(58) Field of Search ................................. 327/65, 66, 52, 327/53, 77, 89; 323/315, 316; 330/252, 253, 257, 258

(56) References Cited

U.S. PATENT DOCUMENTS

| 5,248,946 | * | 9/1993 | Murakami et al. | 327/52 |
| 5,274,275 | | 12/1993 | Colles | 307/362 |
| 5,369,319 | | 11/1994 | Good et al. | 327/73 |
| 5,764,086 | * | 6/1998 | Magamatsu et al. | 327/66 |
| 5,838,149 | * | 11/1998 | Perraud | 327/55 |
| 5,898,323 | * | 4/1999 | Suda | 327/66 |
| 5,994,939 | * | 11/1999 | Johnson et al. | 327/65 |

* cited by examiner

*Primary Examiner*—Toan Tran
(74) *Attorney, Agent, or Firm*—Koppel & Jacobs

(57) ABSTRACT

CMOS comparators are provided that have substantially improved operating frequency ranges. They include first and second differential pairs of transistors and first, second, third and fourth current mirrors. The first and second differential pairs both respond to an analog input signal but only the first differential pair is coupled to define an output port. The first and second current mirrors are cross coupled to the transistors of the first differential pair but each of the third and fourth current mirrors are cross coupled between a respective transistor of the second differential pair and a respective transistor of the first differential pair. The third and fourth current mirrors provide high-speed discharge paths for parasitic circuit capacitances. The comparator structure can be adjusted to control comparator slew rates and hysteresis.

15 Claims, 4 Drawing Sheets

HIGH-SPEED ANALOG COMPARATOR STRUCTURES AND METHODS

BACKGROUND OF THE INVENTION

1. Field of the Invention

The present invention relates generally to signal comparators and more particularly to comparators that are realized with complementary metal-oxide semiconductor (CMOS) processes.

2. Description of the Related Art

FIG. 1 illustrates a comparator 18 that includes a differential pair 22 which receives current from a current source 24. The differential pair 22 is formed of transistors 26 and 28 whose gates and drains are respectively coupled to a comparator input port 30 and a comparator output port 32. The drains of the transistors 26 and 28 are provided with active loads in the form of current mirrors 36 and 38.

In particular, the current mirrors 36 and 38 are cross coupled to the transistors 26 and 28 so that each has an input that responds to a current from a respective one of these transistors and an output that mirrors current to the other. The current mirrors act as current latches to provide positive feedback and to discharge parasitic capacitances associated with the mirror transistors of the current mirrors 36 and 38 and the output port 32.

The conventional comparator 18 has been described in various references (e.g., U.S. Pat. No. 5,274,275 issued Dec. 28, 1993 to Coles, Joseph H. and U.S. Pat. No. 5,369,319 issued Nov. 24, 1994 to Good, Brian K., et al.). It is formed with complementary metal-oxide semiconductor (CMOS) transistors which each have a conductive gate and a channel that are separated by an oxide layer.

This structure is the source of a capacitance that is equally split between a gate-to-source capacitance and a gate-to-drain capacitance when a CMOS transistor is operated in its triode region but, because of the pinch-off effect, is substantially isolated from the drain when the transistor is operated in its saturation region. Although CMOS transistor capacitance is useful in many applications (e.g., memory circuits), it has typically limited the operating range of CMOS comparators to a value (e.g., 200 MHz) that is significantly lower than that of comparators formed with bipolar junction transistors.

There are many electronic systems (e.g., direct digital synthesizers) in which the use of CMOS transistors enhances the performance of a first portion of the system circuits but degrades performance of a smaller second portion (e.g., the comparator 18). The penalty of degraded performance is often accepted in order to gain the reduction of fabrication costs and system size that are realized when the entire system is fabricated with the same CMOS process. This penalty could be avoided with CMOS comparators that have an improved and competitive operating range.

SUMMARY OF THE INVENTION

The present invention is directed to analog CMOS comparators with substantially improved operating ranges that rival those of bipolar comparators. This speed improvement is realized with the addition of independent high-speed discharge paths for parasitic circuit capacitances. Currents on these paths hasten the discharge of the parasitic capacitances, control comparator slew rates and control comparator hysteresis.

In particular, comparators of the invention include first and second differential pairs of transistors and first, second, third and fourth current mirrors. The first and second differential pairs both respond to an analog input signal but only the first differential pair is coupled to define an output port. The first and second current mirrors are cross coupled to the transistors of the first differential pair but each of the third and fourth current mirrors are cross coupled between a respective transistor of the second differential pair and a respective transistor of the first differential pair.

The third and fourth current mirrors dynamically pull charge from parasitic capacitances that are associated with the transistors and the output port. In addition to enhancing discharge of these capacitances, they redirect current from the first and second current mirrors to hasten the transition of the first and second current mirrors from their conduction state to their cutoff state. Accordingly, mirror currents of the first and second current mirrors are reduced which aids in turning off these current mirrors and discharging circuit parasitic capacitances.

Other comparator embodiments may be formed by replacing the first and second differential pairs with first and second differential currents.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 2:
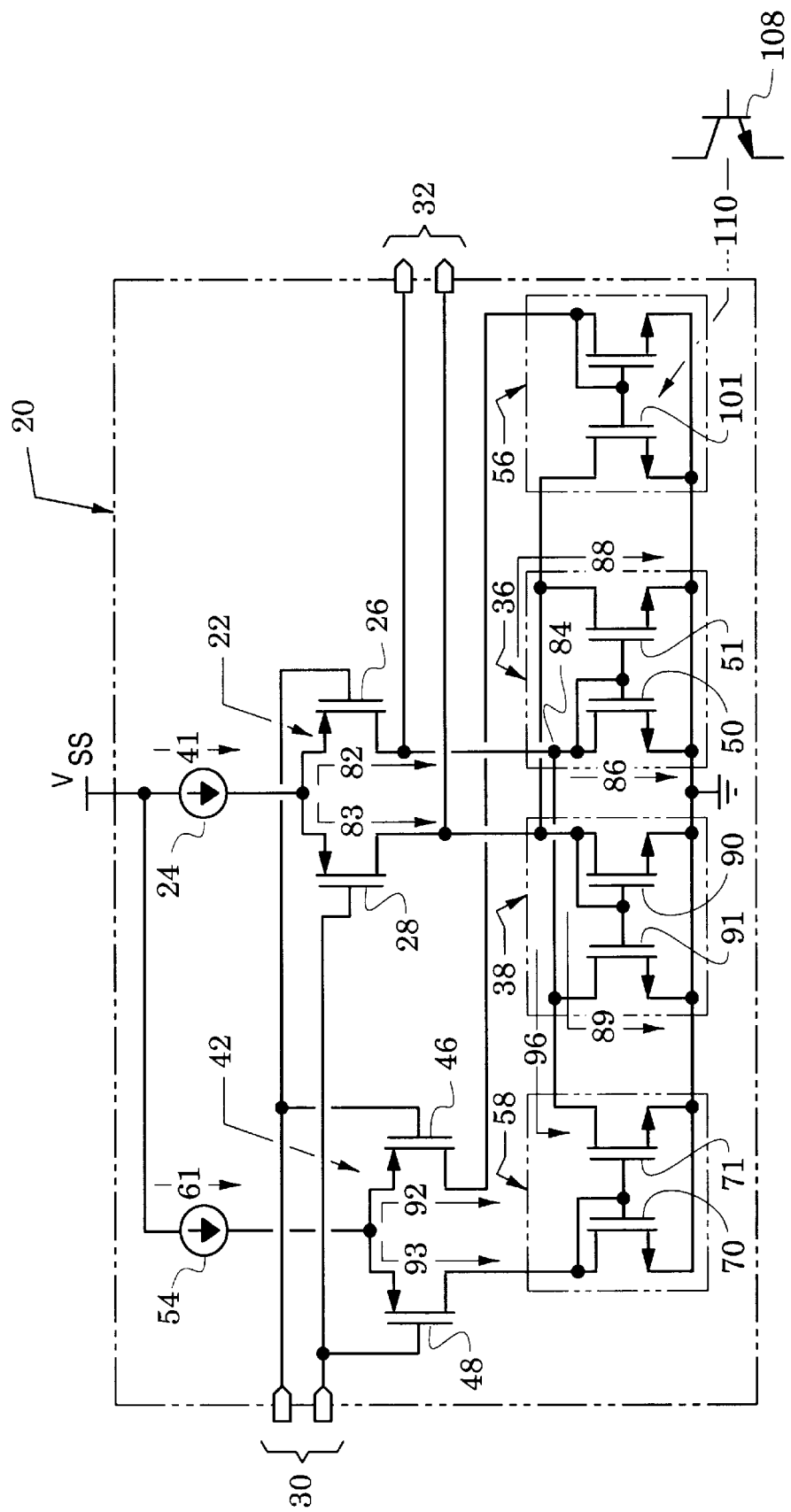
FIG. 2 is a schematic of a comparator of the present invention.

FIG. 2 illustrates a comparator which provides a significantly improved operating frequency range. In addition, parameter values of the comparator can be adjusted to control comparator slew rates and comparator hysteresis.

Figure 1:
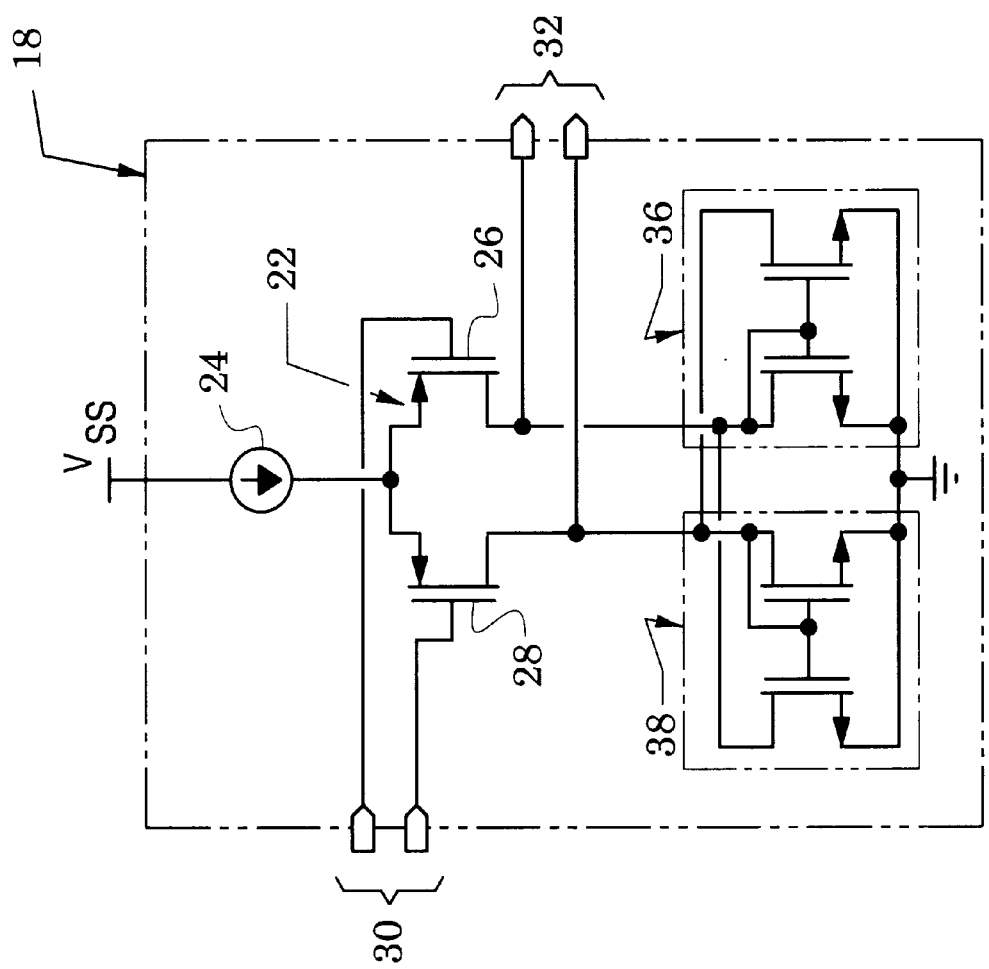
FIG. 1 is a schematic of a conventional comparator.

The comparator 20 includes the first differential pair 22, first current source 24, first and second transistors 26 and 28, input port 30, output port 32 and first and second current mirrors 36 and 38 of the comparator 18 of FIG. 1.

In addition, however, it has a second differential pair 42, a second current source 54 and third and fourth current mirrors 56 and 58 which form active loads for third and fourth transistors 46 and 48 of the second differential pair. The third and fourth current mirrors 56 and 58 are cross-coupled between the first and second differential pairs 22 and 42 to provide high-speed independent discharge paths for the parasitic capacitance that is associated with the gates of the mirror transistors of the current mirrors 36 and 38 and the output port 32.

In particular, the first differential pair 22 is formed of transistors 26 and 28 that have control terminals (i.e., gates) and current terminals (i.e., drains) respectively coupled to a comparator input port 30 and a comparator output port 32. The first current source 24 is connected to a voltage $V_{SS}$ and is coupled to supply a current 41 to the sources of the first differential pair 22.

The first current mirror 36 includes a diode-coupled transistor 50 that is coupled between ground and the drain of transistor 26. It also includes a mirror transistor 51 whose gate and source are respectively coupled to the gate and source of diode-coupled transistor 50 and whose drain is coupled to the drain of the second transistor 28.

The arrangement of the first differential pair 22 and first current mirror 36 can be described more succinctly by stating that the first current mirror 36 is cross-coupled to current terminals of the first differential pair 22. Equivalently, it can be stated that diode-coupled transistor 50 of the first current mirror 36 responds to an excitation current from the first transistor 26 and mirror transistor 51 mirrors current to the second transistor 28 of the first differential pair. Using this simplified description, it is apparent from FIG. 2 that the second current mirror 38 is cross-coupled to respond to current from the drain of the second transistor 28 and mirror current to the drain of the first transistor 26.

The third and fourth transistors 46 and 48 of the second differential pair 42 have their control terminals coupled to the comparator input port 30 but their current terminals are free to generate independent discharge paths. A second current source 54 is connected to the voltage $V_{SS}$ and is coupled to supply a current 61 to the sources of the second differential pair 42.

The third current mirror 56 is cross-coupled to respond to current from the drain of the third transistor 46 and mirror current to the drain of the second transistor 28 of the first differential pair 22. The fourth current mirror 58 is cross-coupled to respond to current from the drain of the fourth transistor 48 and mirror current to the drain of the first transistor 26 of the first differential pair 22. In particular, a diode-coupled transistor 70 of this latter current mirror receives a current from the fourth transistor 48 and a mirror transistor 71 mirrors a current to the first transistor 26.

Figure 3:
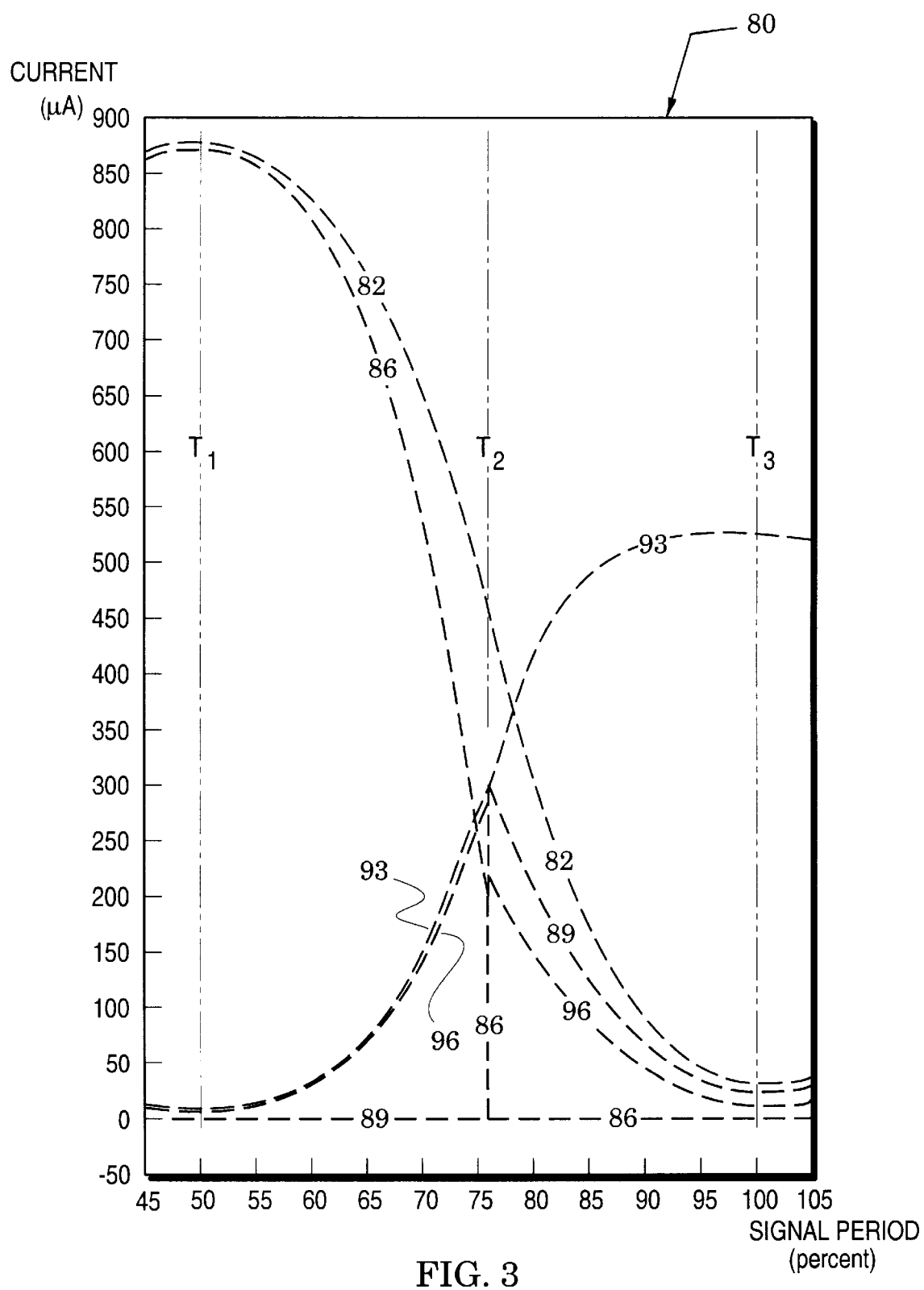
FIG. 3 is a timing diagram that illustrates exemplary current waveforms in the comparator of FIG. 2.

The graph 80 of FIG. 3 illustrates currents that were obtained in a computerized operational simulation of the comparator 20. The simulation particularly examined the response of the comparator at its output port (32 in FIG. 2) to a differential analog input signal at its input port (30 in FIG. 2). Various response currents are plotted in FIG. 3 over the latter one half of a signal period that extends from 50% of the period at a time $T_1$ to 100% of the period at a time $T_3$. An intermediate time $T_2$ is shown between $T_1$ and $T_3$. To facilitate a description of the graph 80, it is helpful to first describe the following exemplary operational currents in the comparator 20 of FIG. 2. These operational currents are particularly described with reference to the region of the time $T_2$ in FIG. 3 (just before a circuit node 84 is switched from a high to a low state).

In the comparator 20, the first current source 24 provides a current 41 and, in response to a differential input signal at the input port 30, the first differential pair 22 alternately steers this current through its transistors 26 and 28 to respectively form currents 82 and 83 that are respectively received by the current mirrors 36 and 38.

The current 82 flows towards a circuit node 84 that connects the first differential pair 22 and the first current mirror 36. In response, the diode-coupled transistor 50 conducts a current 86 away from the circuit node 84 and the mirror transistor 51 mirrors a current 88 away from the second transistor 28. In response to the current 83 and diode-coupled transistor 90, the mirror transistor 91 of the second current mirror 38 mirrors a current 89 away from the circuit node 84. In particular, the current mirror 38 responds to a portion of the current 83 that is not required by the mirror transistor 51 (i.e., the current 88).

The second current source 54 provides a current 61 and, in response to the differential input signal, the second differential pair 42 alternately steers this current through its transistors 46 and 48 to respectively form currents 92 and 93 that are respectively received by current mirrors 56 and 58. The diode-coupled transistor 70 receives the current 93 and, in response, the mirror transistor 71 conducts a current 96 away from the circuit node 84.

Various parasitic capacitances (e.g., gate and interconnection capacitances) are associated with the gates of the current mirrors 36 and 38 and the drains of the first differential pair 22 (and thereby the terminals of the output port 32). These capacitances must be rapidly charged and discharged to realize a differential output signal that properly responds to and properly compares a differential input signal at the input port 30.

Because the currents 82 and 83 of the first differential pair 22 are available to alternately charge these parasitic capacitances, it has been found that charging (or a lack thereof) is not the source of the speed limitations of conventional CMOS comparators (e.g., the comparator 18 of FIG. 1). Instead, it has been found that the speed limitations occur because of insufficient discharge capability for the capacitances associated with the differential terminals of the output port 32.

Accordingly, the simulation that is illustrated in FIG. 3 was especially directed to the study of the discharge of charges accumulated on the gates of the current mirrors 36 and 38 and the drains of the first differential pair 22 of FIG. 2. In particular, the simulation investigated the discharge of the circuit node 84 which has current 82 flowing towards it and currents 86, 89 and 96 flowing away.

In the simulation, the current 41 of the first current source 24 was set at approximately 900 microamperes and the current 61 of the second current source 54 was set at approximately 520 microamperes. The transistors of the comparator were configured with various channel widths W and lengths L. In particular, all transistors were configured with $L \approx 0.6$ $\mu$m, the first and second differential pairs 22 and 42 were configured with $W \approx 80$ $\mu$m, diode-coupled transistors 50 and 90 were configured with $W \approx 16.25$ $\mu$m and all other transistors of the current mirrors 36, 38, 56 and 58 were configured with $W \approx 26$ $\mu$m.

Directing attention now to the graph 80 of FIG. 3, it shows that the current 82 is steered through the first transistor (26 in FIG. 2) to reach a maximum (of approximately 875 microamperes) at time $T_1$ and a minimum (of approximately 30 microamperes) at time $T_3$. The current 93 is steered through the fourth transistor (48 in FIG. 2) to reach a minimum (of approximately 5 microamperes) at time $T_1$ and a maximum (of approximately 525 microamperes) at time $T_3$ and, as expected, is therefore substantially 180° out of phase with the current 82.

In response to the current 93, the current 96 (mirrored by the mirror transistor 71 in FIG. 2) rises between times $T_1$ and $T_2$ and is substantially equal to the current 93. Because it is pulling current away from the circuit node 84, current 96 begins to turn off the diode-coupled transistor 50 of FIG. 2 so that current 86 falls rapidly between times $T_1$ and $T_2$.

In this time interval, the current 89 (through the mirror transistor 91 of FIG. 2) is substantially zero so that the current 82 (flowing to the circuit node 84 in FIG. 2) is the sum of the currents 86 and 96 (flowing away from the circuit node 84). At 70% of the simulated period, for example, FIG. 3 shows that current 96 is 150 microamperes, current 86 is ≅500 microamperes and current 82 is 650 microamperes.

Before examining comparator operation at times $T_2$ and $T_3$, it is helpful to first note that current 83 through the second transistor 28 in FIG. 3 is 180° out of phase with the current 82 in FIG. 3 and is, therefore, substantially off at time $T_1$. At this time, therefore, current 82 is directing a large current 86 through the diode-coupled transistor 50 of FIG. 2 but the mirror transistor 51 cannot mirror a current because the second transistor 28 is off and, consequently, the mirror current 88 is substantially zero. The mirror transistor 51 therefore operates in the CMOS triode region where it is basically a resistor and pulls the voltage on the drain of the second transistor 28 to a low value.

A similar relationship exists at time $T_1$ with the currents through the third transistor 46 (of the second differential pair 42) and through the mirror transistor 101 of the third current mirror 56. Accordingly, mirror transistor 101 (which is also coupled to the drain of the second transistor 28) is also operating in the triode region.

Subsequent to the time $T_1$, the current 83 in the second transistor 28 begins to rise and would otherwise begin to turn on diode-coupled transistor 90 so that the mirror current 89 would begin to also rise. At this time, however, the rising current 83 is required to transition mirror transistor 51 (and mirror transistor 101) out of the triode region.

Returning attention now to FIG. 3, it is noted that just prior to time $T_2$, the rising current 96 has risen to equal the descending current 86. Because of the comparator's positive feedback (effected by the current mirrors 36, 38, 56 and 58), the current 86 is sharply cut off at time $T_2$ which turns off the current 88 through the mirror transistor 51 and diverts current to turn on the current mirror 38. Accordingly, the current 89 comes sharply on at time $T_2$ and, together with the current 96, completes the discharge of the gate of mirror transistor 51 and the drain of the first transistor 26.

Graph 80 thus shows that the current 96 hastens the discharge of the circuit node 84 and, in addition, pulls charge away from diode-coupled transistor 50 and the gate of the mirror transistor 51 of FIG. 2 so that the mirror current 88 rapidly drops and hastens the advent of the state change at circuit node 84. The current 96 of the fourth current mirror 58 significantly enhances discharge of the gate of the mirror transistor 51 and the drain of the first transistor 26 and, therefore, significantly enhances the speed at which a differential comparator signal can be presented at the output port 32. In a similar manner, the third current mirror 56 enhances a similar discharge function in a signal period that follows the period shown in FIG. 3.

Tests of prototypes of the comparator 20 of FIG. 2 have verified this enhancement by demonstrating an operating range (on the order of 400 MHz) that substantially doubles that of conventional CMOS comparators. Further prototype tests have indicated that these comparators are capable of even higher operating ranges so that they rival the speed of bipolar comparators.

As stated above, the simulation shown in graph 80 of FIG. 3 was performed with a particular set of relationships between the currents 41 and 61 of the current sources 24 and 54 and between the sizes of the transistors. Other relationships can be set to obtain specific comparator performances. For example, adjustment of the sizes (width W and length L) of the mirror transistors 51 and 91 has been found to be particularly effective in adjusting the period percentage at which the positive feedback of the comparator causes the current 86 to be turned off in FIG. 3.

This adjustment causes the switching at the output port 32 to occur at selected levels of ascending and descending signals at the differential input port 30, i.e., it adjusts the hysteresis of the comparator. To a lesser degree, the comparator hysteresis can also be adjusted by changing the sizes of the mirror transistors 71 and 101 and by varying the comparative amplitudes of the currents 41 and 61. For hysteresis adjustment, the comparator 20 thus has three degrees of freedom.

An initial examination of the cross-coupled current mirrors of the conventional comparator 18 of FIG. 1 might suggest that the comparator's operating range could be improved by increasing the channel width-to-length ratio of the mirror transistors 51 and 91 in the first and second current mirrors 36 and 38. In contrast to this suggestion, it has been found that this is not effective but that the comparator structure of FIG. 2 is effective.

The suggested modification is not effective because "sizing up" the mirror transistors 51 and 91 increases their gate areas and capacitances so that the accumulated charges on the gate inputs of the current mirrors 36 and 38 are also increased. As circuit node 84 in FIG. 2 is forced to a high voltage state by the current 82 prior to time $T_1$ (see FIG. 3), the gate capacitance of mirror transistor 51 is charged to a voltage equal to the gate-to-source voltage of transistor 50. This charge must be dissipated to allow the comparator to switch states. Larger gate capacitances require larger discharge currents and/or more discharge time to force circuit node 84 to a low voltage state.

Decreasing the channel length L of the transistors that form current mirrors 36 and 38 would decrease overall gate area, lessen the gate capacitance, reduce the needed discharge currents and increase the comparator's speed. Due to limitations in device fabrication, however, this would increase the device-to-device geometry variations in the circuit (e.g., in device and current mirror matching) which would impair the DC performance of the comparator.

In contrast to the suggested modifications, comparators of the invention add a second differential pair whose drains are independently coupled to drive respective current mirrors. This added differential pair provides discharge currents to discharge the gate inputs of mirror transistors (e.g., transistors 51 and 91 in FIG. 2) which allows the comparator to operate at higher speeds while maintaining good DC characteristics.

Figure 4:
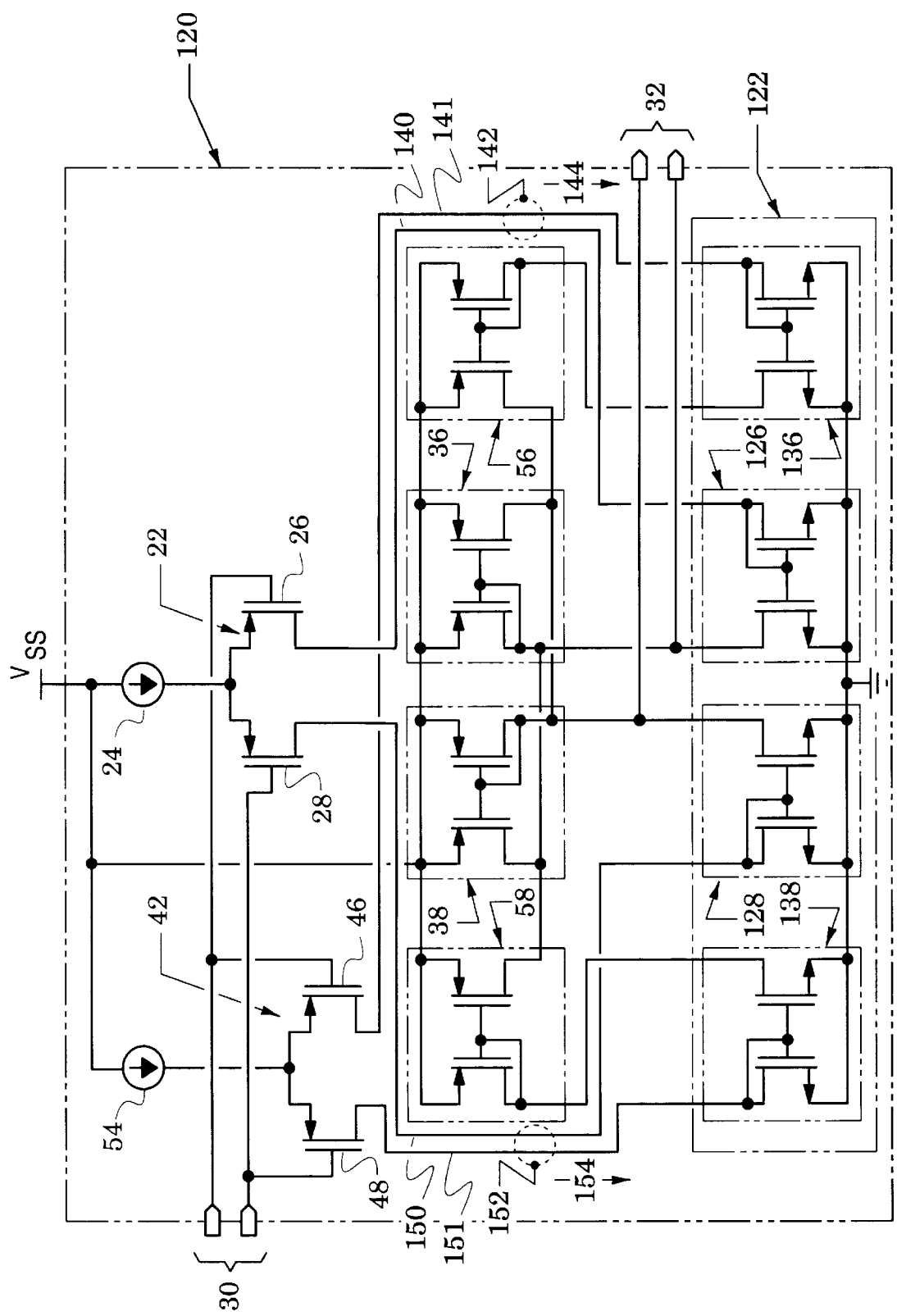
FIG. 4 is a schematic of another comparator of the present invention.

FIG. 4 illustrates another comparator embodiment 120 which is similar to the comparator 20 of FIG. 2 with like elements indicated by like reference numbers. In the embodiment 120, however, a set 122 of current mirrors has been inserted between the first and differential pairs 22 and 42 and their respective current mirrors in the comparator 20 of FIG. 2.

The set 122 includes current mirrors 126 and 128 that are respectively excited by excitation currents from the first and second transistors 26 and 28 of the first differential pair 22 and respectively mirror currents to current mirrors 36 and 38. The set 122 also includes current mirrors 136 and 138 that are respectively excited by excitation currents from the third and fourth transistors 46 and 48 of the second differential pair 42 and respectively mirror currents to current mirrors 56 and 58.

Insertion of the current mirror set 122 may enhance the comparator's noise immunity from a fabrication substrate and from supply lines. In addition, it can generate output signals that are compatible with different transistor families (e.g., emitter-coupled logic).

To facilitate insertion of the current mirror set 122, the current mirrors 36, 38, 56 and 58 are formed with P-channel MOS transistors and coupled to the supply voltage $V_{SS}$. The current mirror set 122 is formed with N-channel MOS transistors and is coupled to ground. Of course, all of the illustrated comparator embodiments can be equivalently altered by switching transistor polarities (e.g., replacing P-channel MOS transistors with N-channel MOS transistors).

Comparators of the invention may also be driven by differential current signals. In the comparator 120 of FIG. 4, for example, the first and second current sources 24 and 54 and the first and second differential pairs 22 and 42 can be eliminated and the remaining comparator driven by first and second differential currents. This is exemplified by coupling the current paths 140 and 141 together as indicated by the broken-line coupling circle 142 and inserting a current 144. In addition, the current paths 150 and 151 are coupled together as indicated by the broken-line coupling circle 152 and inserting a current 154 wherein the currents 144 and 154 are phased to be the first and second differential currents.

The term "cross coupled" has been used herein to enhance descriptive conciseness. It should be apparent, for example, that a current mirror is cross coupled to first and second transistors of a differential pair when the current mirror responds to an excitation current (at an excitation port of the current mirror) of a respective one of the transistors and mirrors a mirror current (at a mirror port of the current mirror) to the other of the transistors. The amplitude of the mirrored current generally has a fixed relationship (e.g., one half, equal or double) to the amplitude of the excitation current. The excitation and mirror currents may be directed as either source or sink currents.

Conciseness has also been enhanced with the functional term "mirrors". It should also be apparent that a current mirror responds to an excitation current regardless of whether this current is entering or exiting the current mirror. The current mirror then responds by mirroring a mirror current. Typically the excitation and mirror currents are both sink currents or both source currents.

Comparators of the invention are particularly suited for realization with CMOS transistors on a common substrate. In such realizations, it is customary to obtain isolation by coupling selected transistor leads to the common substrate. These isolation couplings have not been shown in the figures as their implementation is well known and generally varies with each specific realization.

Although the invention has been illustrated with reference to CMOS transistors, the teachings of the invention can be practiced with any transistors that have current terminals which are responsive to control terminals. For example, bipolar junction transistors can be substituted for CMOS transistors as exemplified by transistor 108 and substitution arrow 110 in FIG. 2.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A comparator that generates a differential output signal at a differential output port in response to the polarity of an input signal, comprising:

a first differential pair of first and second transistors that have control terminals coupled to respond to said input signal and current terminals that are coupled to said differential output port;

first and second current mirrors that are each cross-coupled to current terminals of said first and second transistors;

a second differential pair of third and fourth transistors that have control terminals coupled to respond to said input signal;

a third current mirror that is cross-coupled to current terminals of said second and third transistors; and a fourth current mirror that is cross-coupled to current terminals of said first and fourth transistors.

2. The comparator of claim 1, wherein said first and second differential pairs and said first, second, third and fourth current mirrors are comprised of complementary metal-oxide semiconductor transistors.

3. The comparator of claim 1, wherein said first and second differential pairs and said first, second, third and fourth current mirrors are comprised of bipolar junction transistors.

4. The comparator of claim 1, further including first and second current sources coupled to respectively provide first and second currents to said first and second differential pairs.

5. The comparator of claim 1, further including a set of current mirrors arranged to:

insert a current mirror of said set between each of said first and second current mirrors and their respective current terminals of said first and second transistors; and to insert a current mirror of said set between each of said third and fourth current mirrors and their respective current terminals of said first, second, third and fourth transistors.

6. A comparator that generates a differential output signal at a differential output port in response to the polarity of an input signal, comprising:

a first differential pair of first and second transistors that have control terminals coupled to receive said input signal and current terminals that are coupled to said differential output port;

a first current mirror that responds to current of said first transistor and mirrors current to said second transistor;

a second current mirror that responds to current of said second transistor and mirrors current to said first transistor;

a second differential pair of third and fourth transistors that have control terminals coupled to receive said input signal;

a third current mirror that responds to current of said third transistor and mirrors current to said second transistor;

a fourth current mirror that responds to current of said fourth transistor and mirrors current to said first transistor.

7. The comparator of claim 6, wherein said first and second differential pairs and said first, second, third and fourth current mirrors are comprised of complementary metal-oxide transistors.

8. The comparator of claim 6, wherein said first and second differential pairs and said first, second, third and fourth current mirrors are comprised of bipolar junction transistors.

9. The comparator of claim 6, further including first and second current sources coupled to respectively provide first and second currents to said first and second differential pairs.

10. The comparator of claim 6, further including a set of current mirrors arranged to insert a current mirror of said set between each of said first, second, third and fourth current mirrors and their respective ones of said first, second, third and fourth transistors.

11. A comparator that generates a differential output signal at a differential output port in response to first and second differential currents, comprising:

a first current mirror that responds to said first differential current and mirrors current to a second side of said differential output port;

a second current mirror that responds to said second differential current and mirrors current to a first side of said differential output port;

a third current mirror that responds to said first differential current and mirrors current to said second side; and a fourth current mirror that responds to said second differential current and mirrors current to said first side.

12. The comparator of claim 11, further including a set of current mirrors that are arranged to insert a current mirror of said set between each of said first and third current mirrors and said first differential current and to insert a current mirror of said set between each of said second and third fourth current mirrors and said second differential current.

13. A method of generating a differential output signal on first and second current paths in response to the polarity of an input signal, comprising:

in response to the polarity of said input signal, differentially steering a first current along said first and second current paths;

in response to said first current on said first current path, providing a first discharge current to discharge said second current path;

in response to said first current on said second current path, providing a second discharge current to discharge said first current path;

in response to the polarity of said input signal, differentially steering a second current along third and fourth current paths;

in response to said second current on said third current path, providing a third discharge current to discharge said second current path; and in response to said second current on said fourth current path, providing a fourth discharge current to discharge said first current path.

14. The method of claim 13, wherein said steering and providing steps include the step of conducting currents with complementary metal-oxide semiconductor transistors.

15. The method of claim 13, wherein said steering and providing steps include the step of conducting currents with bipolar junction transistors.

\* \* \* \* \*